United States Patent
McNamara et al.

(10) Patent No.: US 10,840,167 B2
(45) Date of Patent: Nov. 17, 2020

(54) INTEGRATED HEAT SPREADER WITH CONFIGURABLE HEAT FINS

(71) Applicant: Advanced Micro Devices, Inc., Santa Clara, CA (US)

(72) Inventors: Andrew McNamara, Austin, TX (US); Swagata Kalve, West Lafayette, IN (US)

(73) Assignee: ADVANCED MICRO DEVICES, INC., Santa Clara, CA (US)

(*) Notice: Subject to any disclaimer, the term of this patent is extended or adjusted under 35 U.S.C. 154(b) by 47 days.

(21) Appl. No.: 16/194,560

(22) Filed: Nov. 19, 2018

(65) Prior Publication Data
US 2020/0161215 A1    May 21, 2020

(51) Int. Cl.
| | | |
|---|---|---|
| *H01L 23/473* | (2006.01) | |
| *H05K 7/20* | (2006.01) | |
| *H01L 23/373* | (2006.01) | |
| *H01L 23/367* | (2006.01) | |

(52) U.S. Cl.
CPC .......... *H01L 23/473* (2013.01); *H01L 23/367* (2013.01); *H01L 23/3736* (2013.01); *H05K 7/20272* (2013.01); *H05K 7/20281* (2013.01); *H05K 7/20409* (2013.01)

(58) Field of Classification Search
CPC . H01L 23/473; H01L 23/3736; H01L 23/367; H01L 23/42; H01L 23/44; H01L 23/46; H01L 23/3675; H01L 23/3677; H05K 7/20409; H05K 7/20281; H05K 7/20272
See application file for complete search history.

(56) References Cited

U.S. PATENT DOCUMENTS

| | | | |
|---|---|---|---|
| 1,818,387 | A | 7/1928 | Dinzl |
| 5,636,684 | A | 6/1997 | Teytu et al. |
| 5,918,469 | A | 7/1999 | Cardella |
| 6,253,835 | B1 | 7/2001 | Chu et al. |
| 6,343,478 | B1 | 2/2002 | Chang |
| 6,725,682 | B2 | 4/2004 | Scott |
| 6,771,500 | B1 | 8/2004 | Siegel et al. |
| 6,942,018 | B2 | 9/2005 | Goodson et al. |

(Continued)

FOREIGN PATENT DOCUMENTS

JP    2008171840 A    7/2008

OTHER PUBLICATIONS

*Wikipedia; Computer Cooling*; http://en.wikipedia.org/wiki/Computer_cooling; 2006; pp. 1-16.

(Continued)

*Primary Examiner* — Selim U Ahmed

(57) ABSTRACT

Various integrated heat spreaders and methods of making the same are disclosed. In one aspect, an integrated heat spreader to provide thermal management of a first heat generating component on a circuit board is provided. The integrated heat spreader includes a shell that has an internal space, at least one inlet port to receive a coolant to cool the first heat generating component and at least one outlet port to discharge the coolant. Plural heat fins are connected to the shell in the internal space. The heat fins are selectively connectable to the shell in multiple arrangements to provide selected flow rates of the coolant in one or more regions of the internal space.

24 Claims, 10 Drawing Sheets

(56) References Cited

U.S. PATENT DOCUMENTS

| | | | |
|---|---|---|---|
| 7,212,405 B2 | 5/2007 | Prasher et al. | |
| 7,243,705 B2 | 7/2007 | Myers et al. | |
| 7,265,979 B2 | 9/2007 | Erturk et al. | |
| 7,320,359 B2 | 1/2008 | Miettinen et al. | |
| 7,394,659 B2 | 7/2008 | Colgan et al. | |
| 7,471,515 B2 | 12/2008 | Chang et al. | |
| 7,884,633 B2 | 2/2011 | Potok et al. | |
| 2004/0008483 A1 | 1/2004 | Cheon | |
| 2004/0070940 A1 | 4/2004 | Tomioka et al. | |
| 2004/0160741 A1 | 8/2004 | Moss et al. | |
| 2004/0228088 A1 | 11/2004 | Minamitani et al. | |
| 2004/0250994 A1 | 12/2004 | Chordia | |
| 2005/0083647 A1 | 4/2005 | Neho et al. | |
| 2006/0033205 A1 | 2/2006 | Sauciuc et al. | |
| 2006/0050483 A1 | 3/2006 | Wilson et al. | |
| 2006/0065972 A1 | 3/2006 | Khan et al. | |
| 2008/0024980 A1 | 1/2008 | Suzuki et al. | |
| 2011/0267768 A1 | 11/2011 | Attlesey | |
| 2014/0268572 A1 | 9/2014 | Ranjan et al. | |
| 2015/0035760 A1 | 2/2015 | Wu et al. | |
| 2015/0070836 A1 | 3/2015 | Yairi et al. | |
| 2015/0131224 A1 | 5/2015 | Barina et al. | |
| 2015/0220121 A1 | 8/2015 | Loo et al. | |
| 2015/0234438 A1 | 8/2015 | Druzhinin et al. | |
| 2016/0270205 A1 | 9/2016 | Kamimura | |
| 2019/0385925 A1* | 12/2019 | Walczyk | H01L 23/3675 |

OTHER PUBLICATIONS

PCT/US2019/039783 International Search Report dated Oct. 23, 2019.

* cited by examiner

INTEGRATED HEAT SPREADER WITH CONFIGURABLE HEAT FINS

BACKGROUND OF THE INVENTION

Many conventional packaged integrated circuits such as microprocessors and graphics processors, involve the mounting of a semiconductor chip on a circuit board and the subsequent mounting of a lid over the chip and on the circuit board to serve as a heat spreader. Another cooling device, such as a heat sink, is mounted on the package lid and provided with a thermal pathway typically by way of a polymeric thermal interface material. Cooling fans are used to move air past the lid and the heat sink mounted thereon to dissipate heat. In some systems, a liquid cooling arrangement is used that typically includes a cold plate that functions as a heat exchanger that is mounted on a package lid and is supplied with a flowing coolant by way of a pump and a cooling fan that is attached to another heat exchanger and cooling fan. The thermal pathway between the semiconductor chip and the cold plate is typically constrained thermally by way of a polymeric thermal interface material positioned between the plate and whatever covers the chip.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
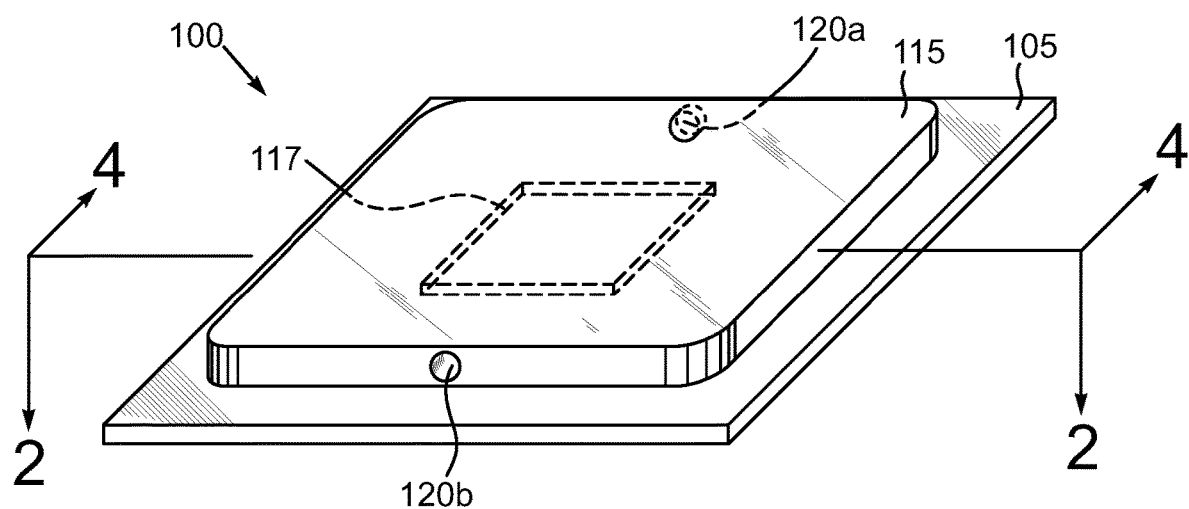
FIG. 1 is a pictorial view of an exemplary semiconductor chip device that includes a circuit board and an integrated heat spreader (IHS)

There are several types of conventional liquid cooling systems for semiconductor chips in computing systems. One conventional variant consists of a copper cold plate that includes internal fins and is designed to seat on the semiconductor chip to be cooled. A coolant is pumped, typically from an external pump or source, into and out of the cold plate. The interface between the cold plate and the semiconductor chip is typically a polymer thermal interface material that, while providing favorable compliant contact properties, nevertheless exhibits relatively low thermal conductivity on the order of less than 5 W/m-K. Sometimes circuit boards, such as semiconductor chip package substrates, use a common physical foot print but can be fitted with different types and numbers of semiconductor chips. These multiple heat generating components that are mounted on the circuit board can generate different levels of heat flux. Accordingly, a one size fits all approach to liquid cooling solutions for these multi-configuration, but common footprint circuit boards may render a less than suitable thermal solution. Similarly, necessitating a full design change for a semiconductor chip package substrate lid for different preferred thermal solutions can be a costly undertaking. The disclosed arrangements provide for an integrated heat spreader that has configurable heat fins so that a common shell design can provide thermal management for a variety of different chip and circuit board combinations and heat flux values.

In accordance with one aspect of the present invention, an integrated heat spreader to provide thermal management of a first heat generating component on a circuit board is provided. The integrated heat spreader includes a shell that has an internal space, at least one inlet port to receive a coolant to cool the first heat generating component and a least one outlet port to discharge the coolant. Plural heat fins are connected to the shell in the internal space. The heat fins are selectively connectable to the shell in multiple arrangements to provide selected flow rates of the coolant in one or more regions of the internal space.

The integrated heat spreader comprising the circuit board and wherein the integrated heat spreader is mounted on the circuit board over the first heat generating component.

The integrated heat spreader wherein the first heat generating component is in fluid communication with the coolant.

The integrated heat spreader wherein the first heat generating component is not in fluid communication with the coolant.

The integrated heat spreader wherein the heat fins are connected to the shell by friction.

The integrated heat spreader wherein at least one of the heat fins is in physical contact with the first heat generating component.

The integrated heat spreader wherein each of at least some of the fins comprises a coolant inlet port and a coolant outlet port.

The integrated heat spreader wherein the shell comprises plural slots to receive the heat fins.

The integrated heat spreader wherein at least some of the heat fins have a textured exterior surface.

The integrated heat spreader comprising a second heat generating component on the circuit board, the heat fins being arranged to provide a first fraction of an inlet flow rate of the coolant past the first heat generating component and a second fraction of the inlet flow rate of the coolant past the second heat generating component.

In accordance with another aspect of the present invention, a semiconductor chip device includes a circuit board, a first heat generating component mounted on the circuit board, an integrated heat spreader mounted on the circuit board to provide thermal management of the first heat generating component, the integrated heat spreader including a shell having an internal space, at least one inlet port to receive a coolant to cool the first heat generating component and a least one outlet port to discharge the coolant, and plural heat fins connected to the shell in the internal space. The heat fins are selectively connectable to the shell in multiple arrangements to provide selected flow rates of the coolant in one or more regions of the internal space.

The semiconductor chip device wherein the first heat generating component is in fluid communication with the coolant.

The semiconductor chip device wherein the first heat generating component is not in fluid communication with the coolant.

The semiconductor chip device wherein the heat fins are connected to the shell by friction.

The semiconductor chip device wherein at least one of the heat fins is in physical contact with the first heat generating component.

The semiconductor chip device wherein each of at least some of the fins comprises a coolant inlet port and a coolant outlet port.

The semiconductor chip device comprising a second heat generating component on the circuit board, the heat fins being arranged to provide a first fraction of an inlet flow rate of the coolant past the first heat generating component and a second fraction of the inlet flow rate of the coolant past the second heat generating component.

In accordance with another aspect of the present invention, a method of manufacturing an integrated heat spreader operable to provide thermal management of a first heat generating component on a circuit board is provided. The method includes fabricating a shell having an internal space, at least one inlet port to receive a coolant to cool the first heat generating component and at least one outlet port to discharge the coolant. Plural heat fins are connected to the shell in the internal space. The heat fins are selectively connectable to the shell in multiple arrangements to provide selected flow rates of the coolant in one or more regions of the internal space.

The method comprising mounting the integrated heat spreader on the circuit board over the first heat generating component.

The method wherein the first heat generating component is in fluid communication with the coolant.

The method wherein the first heat generating component is not in fluid communication with the coolant.

The method wherein at least one of the heat fins is in physical contact with the first heat generating component.

The method comprising connecting the heat fins to the shell by friction.

The method wherein the circuit comprises a second heat generating component, the method comprising arranging the heat fins to provide a first fraction of an inlet flow rate of the coolant past the first heat generating component and a second fraction of the inlet flow rate of the coolant past the second heat generating component.

Figure 2:
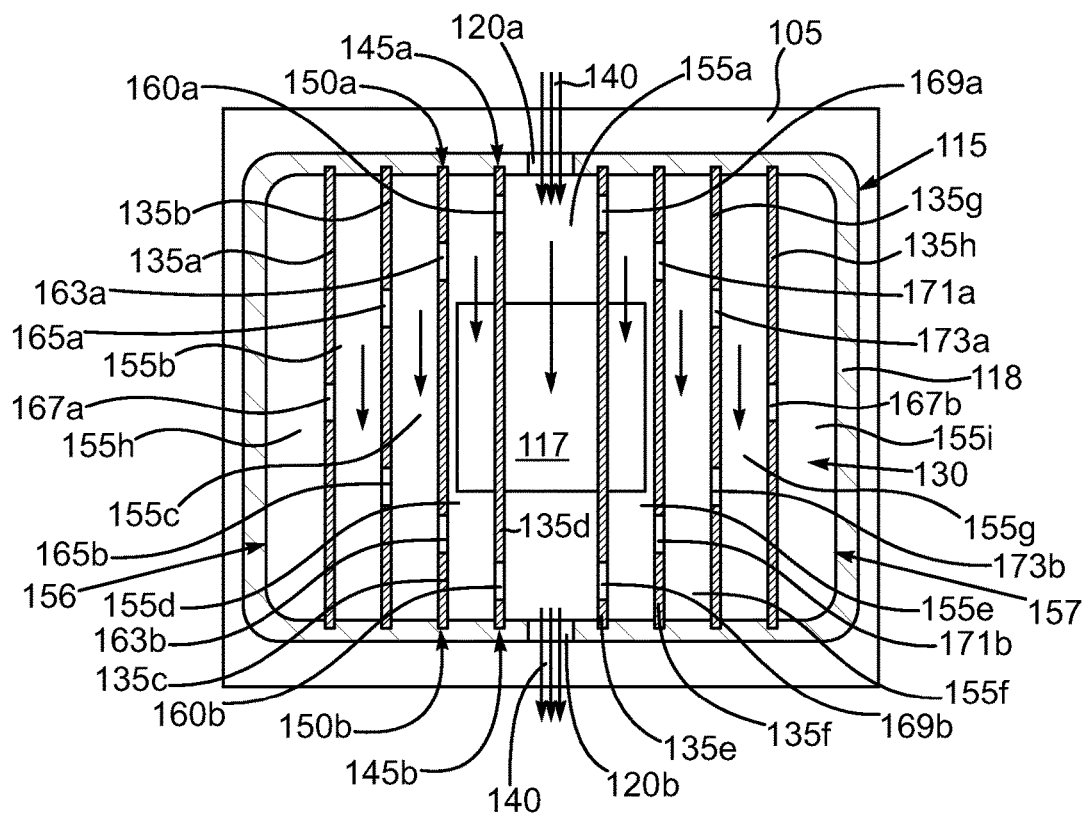
FIG. 2 is a sectional view of FIG. 1 taken at section 2-2.

In the drawings described below, reference numerals are generally repeated where identical elements appear in more than one figure. Turning now to the drawings, and in particular to FIGS. 1 and 2, therein is shown a pictorial view and a sectional view, respectively, of an exemplary arrangement of a semiconductor chip device 100 that includes a circuit board 105, an integrated heat spreader (IHS) 115 mounted thereon that serves as a vessel for transport of cooling liquid and a semiconductor chip 117 (obscured by the IHS 115 and thus shown in dashed) that is mounted on the circuit board 105. Note that section 2-2 of FIG. 1 shown in FIG. 2 is taken through the IHS 115, but the underlying semiconductor chip 117 is not shown in section nor is the circuit board 105. As shown in FIGS. 1 and 2, the IHS 115 includes a shell 118 that has a fluid inlet/outlet port 120a (obscured by the IHS 115 and thus shown in dashed) and another fluid inlet/outlet port 120b. The inlet/outlet ports 120a and 120b are designed to receive fluid supply and return lines respectively. These lines and fittings are not shown in FIGS. 1 and 2, but an example will be depicted in a subsequent figure and described in detail below. It should be understood that the ports 120a and 120b can number more than two.

Figure 3:
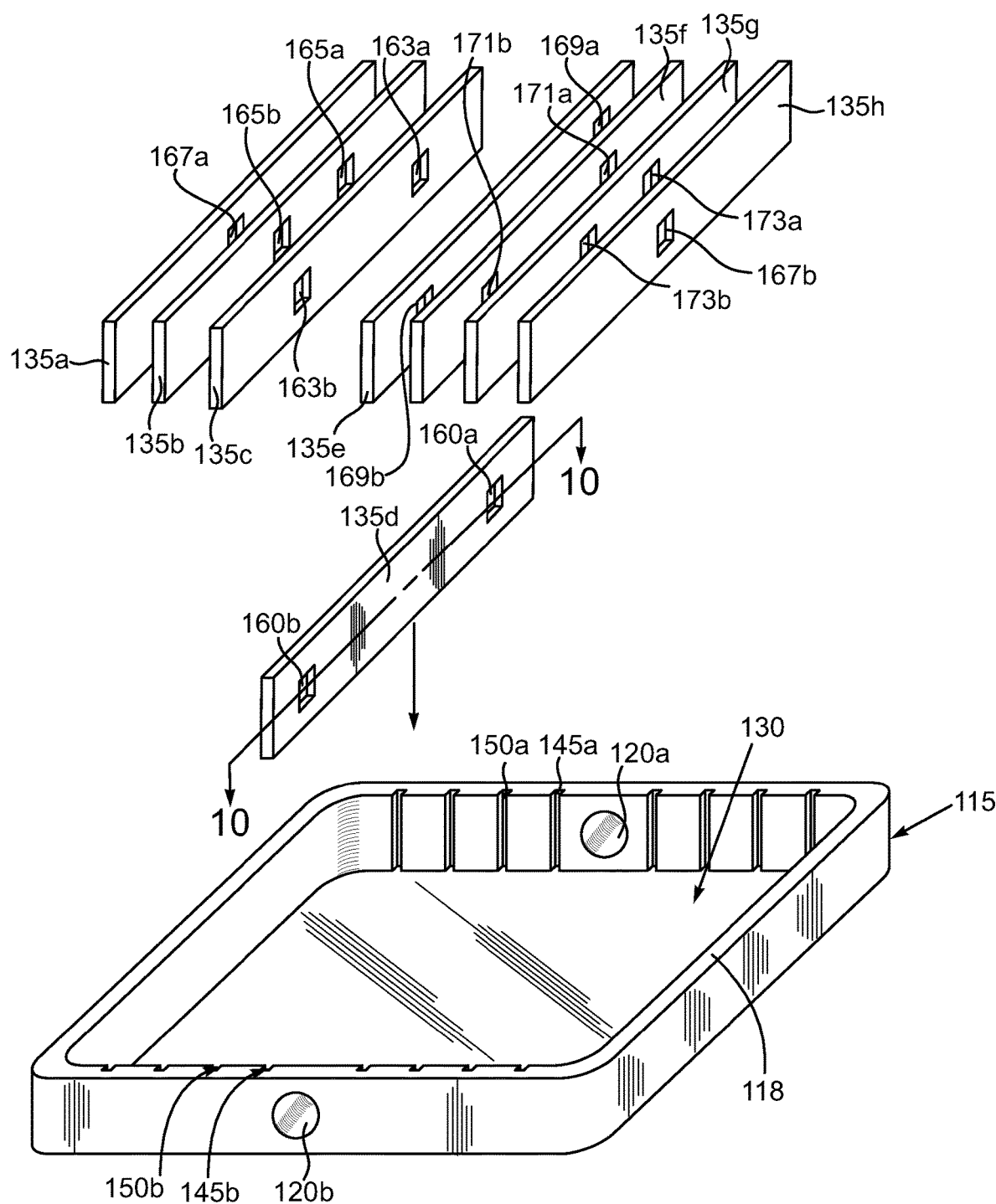
FIG. 3 is an exploded pictorial view of the exemplary IHS depicted in FIGS. 1 and 2.

In this illustrative arrangement, the IHS 115 can be a bathtub design. However, the skilled artisan will appreciate that other configurations such as top hat or other shapes can be used as well. As shown in FIG. 2, the shell 118 of the IHS 115 defines an internal space 130 that is populated by plural configurable heat fins 135a, 135b, 135c, 135d, 135e, 135f, 135g and 135h. The heat fins 135a, 135b, 135c, 135d, 135e, 135f, 135g and 135h are configurable in that they can number other than eight as shown in FIG. 2, can be manufactured in different sizes and can be connected in the internal space 130 of the shell 118 at various positions to provide customizable amounts of convective heat transfer by way of a coolant 140 that is introduced via the port 120a and exits via the 120b or vice versa. As described in more detail below, by varying the number and position of the fins 135a, 135b, 135c, 135d, 135e, 135f, 135g and 135h, the available surface area for convective heat transfer can be customized as well as the flow pattern of the coolant 140 past a heat generating component, in this case the semiconductor chip 117. The heat fins 135a, 135b, 135c, 135d, 135e, 135f, 135g and 135h in this illustrative arrangement are secured at each of their ends by inserting the heat fins 135a, 135b, 135c, 135d, 135e, 135f, 135g and 135h into corresponding slots in the shell 118 of the IHS 115. These structural features may be better understood by referring now also to FIG. 3, which is an exploded pictorial view depicting the IHS 115 flipped over from the orientation depicted in FIGS. 1 and 2 and the fins 135a, 135b, 135c, 135d, 135e, 135f, 135g and 135h exploded therefrom. Note that the fin 135d is shown positioned vertically over a corresponding pair of end slots 145a and 145b in the shell 118 of the IHS 115. The fin 135c is similarly insertable into respective end slots 150a and 150b of the shell 118 and so on for the other fins 135a, 135b, 135e, 135f, 135g and 135h and their corresponding slots, which are shown in FIG. 3 but not numbered. The fins 135a, 135b, 135c, 135d, 135e, 135f, 135g and 135h can be retained in the slots 150a, 150b, etc., by friction, adhesives, solders, brazing, fasteners, such as screws or others.

As better seen in FIG. 2, the fins 135d and 135e define a central channel 155a through which the coolant 140 flows. On one side of the central channel 155a, there is a channel 155d between the fins 135c and 135d, a channel 155b between the fins 135b and 135c, and a channel 155b between the fins 135a and 135b and a leftmost channel 155h between the fin 135a and the wall 156 of the shell 118 of the IHS 115. On the opposite side of the central channel 155a, there is a channel 155e between the fins 135e and 135f, a channel 155f between the fins 135f and 135g, a channel 155g between the fins 135g and 135h and a rightmost channel 155i between the fin 135h and the wall 157 of the shell 118. Fluid communication between the central channel 155a and the channel 155d is provided by way of two or more ports 160a and 160b in the fin 135d. Fluid communication between the channels 155d and 155c is similarly provided by two or more ports 163a and 153b in the fin 135c. Fluid communication between the channels 155c and 155b is provided by two or more ports 165a and 165b in the fin 135b. Finally, the leftmost fin 135a and the rightmost fin 135h can include one or more ports and in this illustrative arrangement single ports 167a and 167b, respectively, which enable the coolant 140 to move into the leftmost channel 155h and the rightmost channel 155i. Here, single ports 167a and 167b are provided such that the coolant 140 present in the channels 155h and 155i will typically not experience much flow and thus natural convection will be the predominant heat transfer mechanism. However, multiple ports could also be provided to enable inflow and outflow and thus forced convection. The fins 135e, 135f and 135g on the other side of the central channel 155a can be similarly provided with two more port 169a and 169b, 171a and 171b and 173a and 173b, respectively, to provide fluid communication between the central channel 155a and the channels 155e, 155f, 155g and 155h, respectively. As described in more detail below, any of the ports 160a, 160b, 169a, 169b, etc., can have a variety of different cross sections. Examples include rectangular, square, circle, or other. The external surfaces of the fins 135a, 135b, 135c, 135d, 135e, 135f, 135g and 135h can be smooth, or for increased heat transfer capability, be textured in various ways to provide enhanced surface areas for heat transfer.

Figure 4:
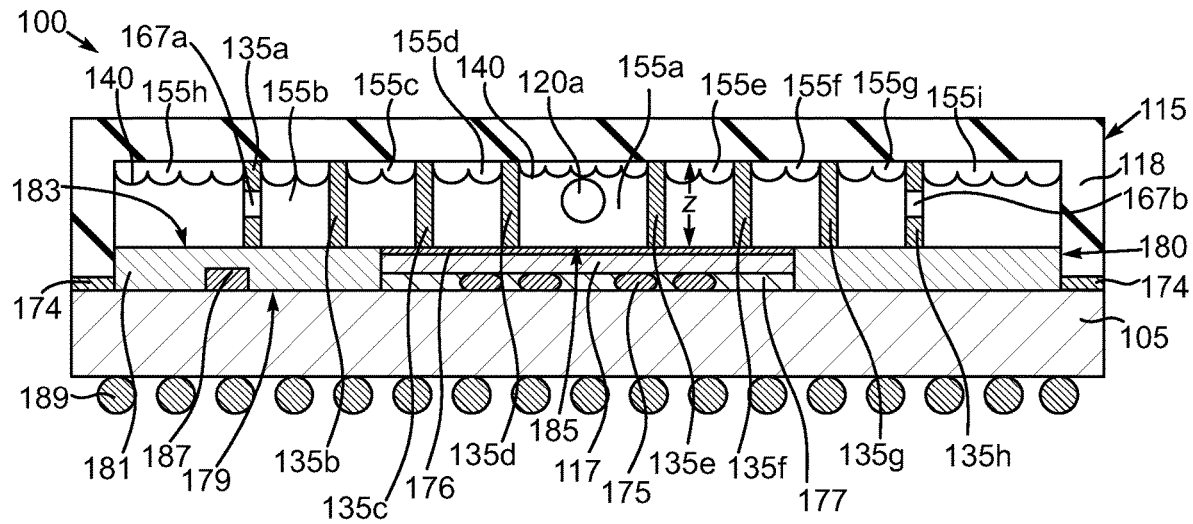
FIG. 4 is a sectional view of FIG. 1 taken at section 4-4.

Additional details of the exemplary arrangement of the semiconductor chip device 10 depicted in FIG. 1 may be understood by referring now also to FIG. 4, which is a sectional view of FIG. 1 taken at section 4-4. Note that because of the location of section 4-4, the shell 118 of the IHS 115, the circuit board 10 and some of the internal structure inside the shell 118 are all illustrated in section. Note also that because of the location of section 4-4, the ports 167a and 167b of the fins 135a and 135h, respectively, are visible. However, the other ports of the fins 135b, 135c, 135d, 135e, 135f and 135g are not visible. Note also that the port 120a of the IHS 115 is visible. The IHS 115 can be secured to the circuit board 105 by way of a suitable adhesive 174, such as various well-known epoxies or others. Here, the semiconductor chip 117 is shown in section and can be electrically connected to the circuit board 105 by way of plural interconnects 175, which can be solder micro bumps, conductive pillars or other types of interconnect structures. The backside of the semiconductor chip 117 can be fitted with a thermal interface material (TIM) 176 composed of thermally conducting materials, such as polymers like silicone, with or without fillers, such as silver, boron nitride or others, or solder or solder-like materials, such as indium, indium-bismuth, or other types of solder materials. Note that at least one of the fins 135c, 135d etc., can be in physical contact with the TIM 176 and could even be metallurgically bonded thereto if a the TIM 176 undergoes a reflow after mounting the IHS 115. To lessen the effects of differences in coefficients of thermal expansion, the space between the semiconductor chip 117 and the circuit board 105 can be filled with an underfill material 177. The upper surface 179 of the circuit board 105 lateral to the semiconductor chip 117 but between the walls 156 and 157 of the shell 118 of the IHS 115 can be filled with a polymeric material 181, which can be any of a variety of well known polymers, such as epoxies, molded polymers or others. The upper surface 183 of the polymer fill 181 can be coplanar with the upper surface 185 of the semiconductor chip 117 or not coplanar as desired. The polymer material 181 can serve as a protected layer for any surface components 187, which are mounted on the circuit board 105, such as capacitors, inductors, resistors or other components. In the event that the polymer fill 181 is used, the fins 135a, 135b, 135c, 135d, 135e, 135f, 135g and 135h can be fabricated to have a height z such that they seat on the polymer fill 181 and the upper surface 185 of the semiconductor chip 117 and in this case the TIM 176. Of course if the polymer fill 181 is not used, then those fins such as the fins 135a, 135b, 135g and 135h, which are not positioned over the semiconductor chip 117 can have a height greater than z and extend down further vertically than what is shown in FIG. 4. In this illustrative arrangement, although the coolant 140 is present in all of the channels 155a, 155b, 155c, 155d, 155e, 155f, 155g, 155h and 155i, only the coolant 140 flowing in the channels 155a, 155c, 155e and 155f will have direct fluid communication with the chip 117.

The circuit board 105 can be a semiconductor package substrate, a circuit card, a system board or other. The circuit board 105 can electrically interface with another device such as another circuit board or other device by way of plural interconnects 189, which can be solder balls, solder bumps, conductive pillars, pins or other types of interconnect structures. The semiconductor chip 117 can be virtually any heat producing device. A non-exhaustive list of examples includes microprocessors, graphics processing units, accelerated processing units that combines aspects of both, memory devices, application specific integrated circuits or others. The IHS 115 and the fins 135a, 135b, 135c, 135d, 135e, 135f, 135g and 135h can be constructed of various materials suitable for heat transfer devices, such as copper, nickel-jacketed copper, aluminum or the like. Even more exotic materials, such as sapphire or diamond could be used where extreme heat is anticipated. If constructed of metal materials, the IHS 115 and the fins 135a, 135b, 135c, 135d, 135e, 135f, 135g and 135h can be machined, cast, plated, stamped or otherwise fabricated. The coolant 140 can be water, glycol or other liquid coolants.

A more detailed description of the flow of coolant 140 through the IHS 115 will now be described in conjunction with FIG. 5, which is a sectional view like FIG. 2. Coolant 140 enters the central channel 155a through the port 120a and a portion thereof passes through the port 160a of the fin 135d and enters the channel 155d and another portion proceeds down the central channel 155a. Some of the coolant 140 that passes through the port 160a flows down the channel 155d and some passes through the port 163a in the fin 135c and enters the channel 155c. Some of the coolant 140 that passes through the port 163a flows down the channel 155c and some passes through the port 165a in the fin 135b and enters the channel 155b. Some of the coolant 140 that passes through the port 165a flows down the channel 155b and some passes through the port 167a in the fin 135a and enters the channel 155h. Coolant 140 flowing in the channel 155b returns to the channel 155c via the port 165b. Coolant 140 flowing in the channel 155c returns to the channel 155d via the port 163b. Coolant flowing in the channel 155*d* returns to the central channel 155*a* via the port 160*b*. In like fashion, some of the coolant 140 that enters the central channel 155*a* via the port 120*a* enters the channel 155*e* via the port 169*a* of the fin 135*e*. Some of the coolant 140 that passes through the port 169*a* flows down the channel 155*e* and some passes through the port 171*a* in the fin 135*f* and enters the channel 155*f*. Some of the coolant 140 that passes through the port 171*a* flows down the channel 155*f* and some passes through the port 173*a* in the fin 135*g* and enters the channel 155*g*. Some of the coolant 140 that passes through the port 173*a* flows down the channel 155*g* and some passes through the port 167*b* in the fin 135*h* and enters the channel 155*i*. Coolant 140 flowing in the channel 155*g* returns to the channel 155*f* via the port 173*b*. Coolant 140 flowing in the channel 155*f* returns to the channel 155*e* via the port 171*b*. Coolant flowing in the channel 155*e* returns to the central channel 155*a* via the port 169*b*. Finally, coolant 140 exits the IHS 115 via the port 120*b*. In this illustrative arrangement the fins 135*a*, 135*b*, 135*c*, 135*d*, 135*e*, 135*f*, 135*g* and 135*h* are symmetrically arranged with respect to the ports 120*a* and 120*b* and thus the flow behavior of the coolant 140 in the channels 155*d*, 155*c*, 155*b* and 155*h* will essentially be a mirror image of the fluid flow behavior of the coolant 140 in the channels 155*e*, 155*f*, 155*g* and 155*i*. However, as described in more detail below, the arrangement of the fins 135*a*, 135*b*, 135*c*, 135*d*, 135*e*, 135*f*, 135*g* or their alternatives can be asymmetric in order to achieve a selective fluid discharge in one region of the internal space 130 and another disparate discharge rate in another region of the internal space 130.

Figure 5:
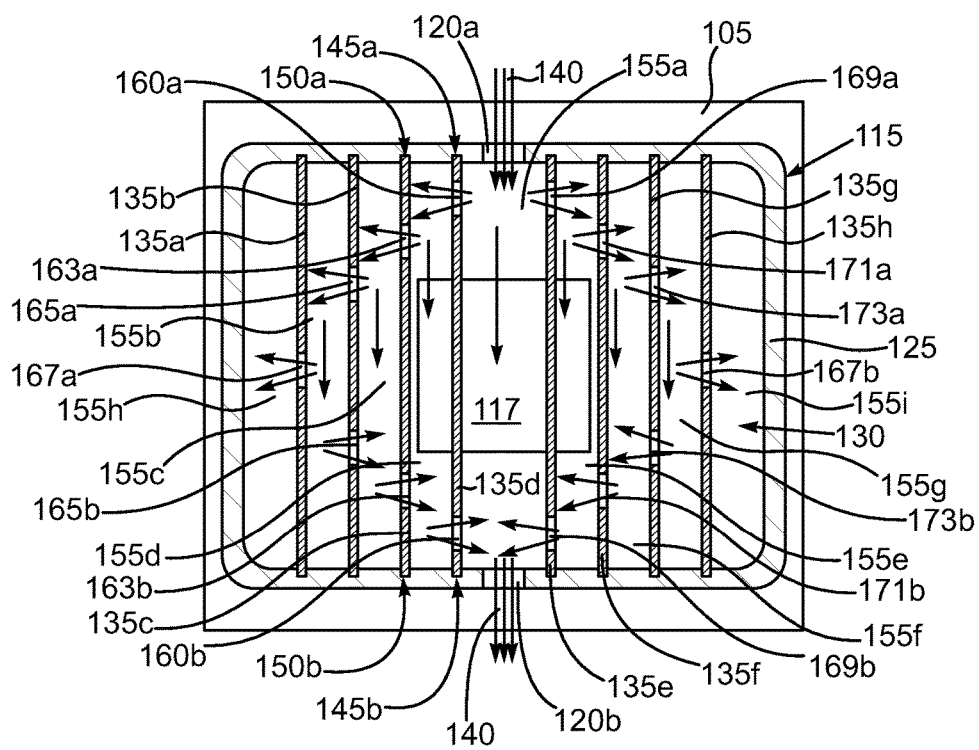
FIG. 5 is a sectional view like FIG. 2 but depicting more detailed fluid flow patterns.
Figure 6:
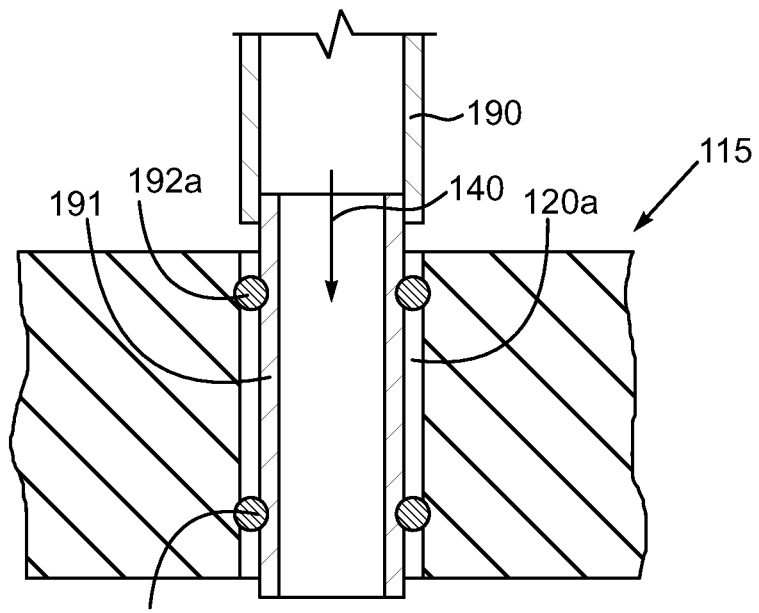
FIG. 6 is an enlarged sectional view of an exemplary fluid supply/return coupling.

Coolant 140 is supplied to and from the inlet/outlet ports 120*a* and 120*b* of the IHS 115 shown in FIG. 5 by suitable fluid supply and return lines which are not shown. However, FIG. 6 depicts an enlarged view of the inlet/outlet port 120*a* with an exemplary fluid supply line 190 connected thereto by a coupling 191. In this illustrative arrangement, the coupling 191 can be a male coupling sealed in the port 120*a* by way of o-rings 192*a* and 192*b*. The coupling 191 can be joined to the supply line 190 by thermal bonding, adhesives or other techniques. Well-known polymers can be used for the line 190 and well-known metals or polymers can be used for the coupling 191. The same structures can be used for both supply and return. Of course, other fluid lines and coupling structures could be used to convey the coolant 140.

Figure 7:
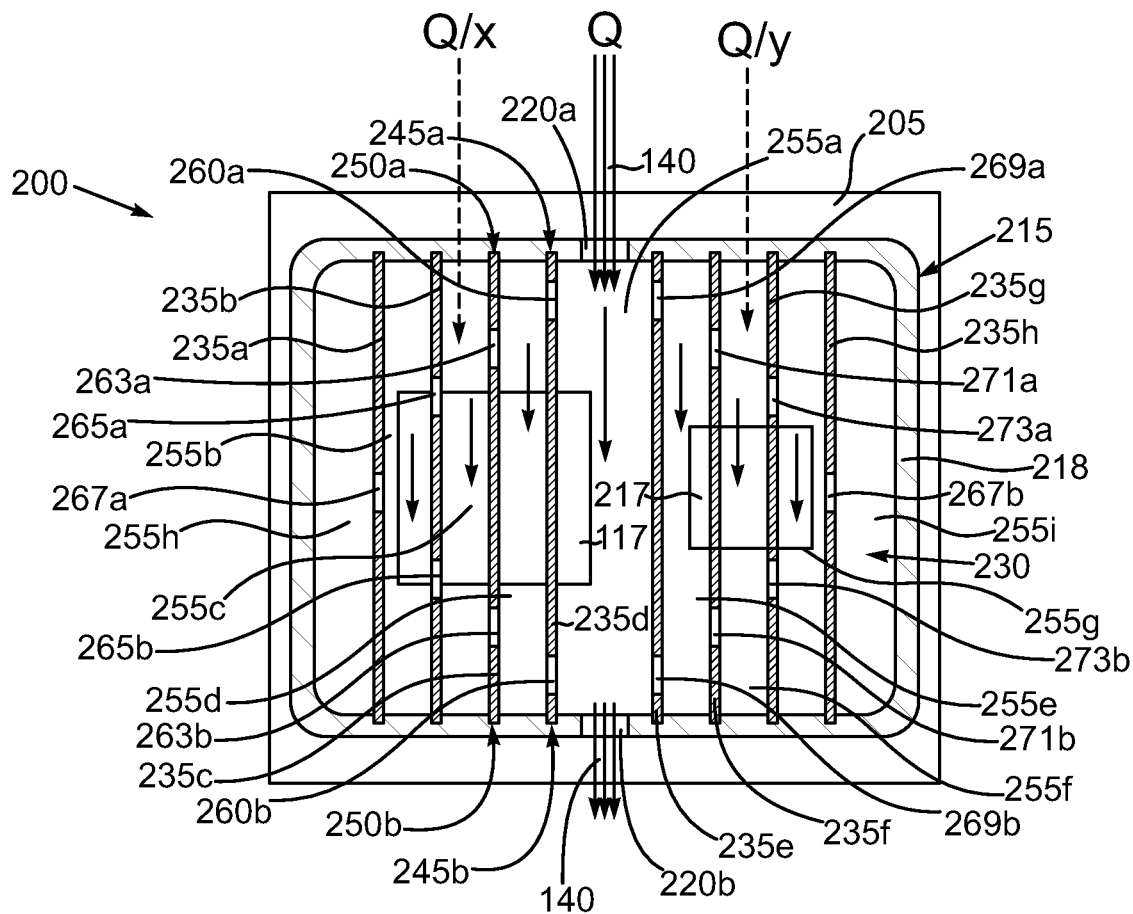
FIG. 7 is a sectional view like FIG. 2 but depicting an alternate exemplary semiconductor chip device with multiple heat generating components and asymmetric heat fin arrangements.

As noted briefly above, the disclosed arrangements can provide the capability of providing selective coolant flow rates for different areas within the internal space of a circuit board IHS. In this regard, attention is now turned to FIG. 7, which is a sectional view like FIG. 2 but of an alternate exemplary semiconductor chip device 200. In this alternate exemplary arrangement, the semiconductor chip device 200 includes a circuit board 205, two semiconductor chips, the semiconductor chip 117 and another semiconductor chip 217, mounted on the circuit board 205 and a IHS 215 also mounted on the circuit board 205. The IHS 215 includes a shell 218 with ports 220*a* and 220*b*. Assume for the purposes of this illustration, that the semiconductor chip 117 produces a higher heat flux than the semiconductor chip 217 and thus would benefit from a higher flow rate of coolant 140 than the semiconductor chip 217. Also assume that at steady state conditions at some point in time after initiation of flow of the coolant 140 an input discharge Q of coolant 140 enters the port 220*a* and thereafter exits the port 220*b* of the IHS 215. Here, it is desirable to subdivide the input discharge Q into a discharge Q/X that is generally supplied or flowed past the higher heat producing semiconductor chip 117 and a smaller fraction Q/Y of the input discharge Q past the lower heat producing semiconductor chip 217. In other words, Y>X, Q/X>Q/Y and Q/X+Q/Y=1. This can be accomplished in a variety of ways. For example, in this illustrative arrangement, the area of the internal space 230 proximate the semiconductor chip 117 can include the customizable fins 235*a*, 235*b*, 235*c* and 235*d* inserted into the end slots 245*a*, 245*b*, 250*a*, 250*b*, etc. Like the fins 135*a*, 135*b*, 135*c* and 135*d*, ports 160*a*, 160*b*, 163*a*, 163*b*, 165*a*, 165*b* and 167*a* and channels 155*a*, 155*b*, 155*c*, 155*d* and 155*h* described above, the fins 235*a*, 235*b*, 235*c* and 235*d* have ports 260*a*, 260*b*, 263*a*, 263*b*, 265*a*, 265*b* and 267*a* that define or partially define the channels 255*a*, 255*b*, 255*c*, 255*d* and 255*h*. However, the portion of the internal space 230 closer to and over the lower heat generating semiconductor chip 217 can include configurable heat fins 235*e*, 235*f*, 235*g* and 235*h* that are provided with ports that are smaller or otherwise provide a lower flow rate than the ports 260*a*, 260*b*, 263*a*, 263*b*, 265*a*, 265*b* and 267*a* to thus restrict the flow in the channels 255*e*, 255*f*, 255*g* and 255*i* defined between the fins 235*e*, 235*f*, 235*g* and 235*h*. Thus, for example, the fin 235*e* can include ports 269*a* and 269*b*, the fin 235*f* can include ports 271*a* and 271*b*, the fin 235*g* can include ports 273*a* and 273*b* and the fin 235*h* can include a port 267*b* where the ports 269*a*, 269*b*, 271*a*, 271*b*, 273*a*, 273*b* and 267*b* can be proportionally smaller than the ports 260*a*, 260*b*, 263*a*, 263*b*, 265*a*, 265*b* and 267*a* of the fins 235*a*, 235*b*, 235*c* and 235*d*. This is just one possible way to subdivide the input discharge Q into the fractional discharges Q/X and Q/Y. Other techniques could include utilizing more or less ports for one or more of the fins 235*a*, 235*b*, 235*c*, 235*d*, 235*e*, 235*f*, 235*g* and 235*h*. Other possibilities include using different numbers of fins for the region of the internal space 230 proximate the semiconductor chip 117 versus the region of the internal space 230 proximate the semiconductor chip 217. The spacing between individual fins 235*a*, 235*b*, 235*c*, 235*d*, 235*e*, 235*f*, 235*g* and 235*h* can also be selectively manipulated to achieve differential discharge rates.

Figure 8:
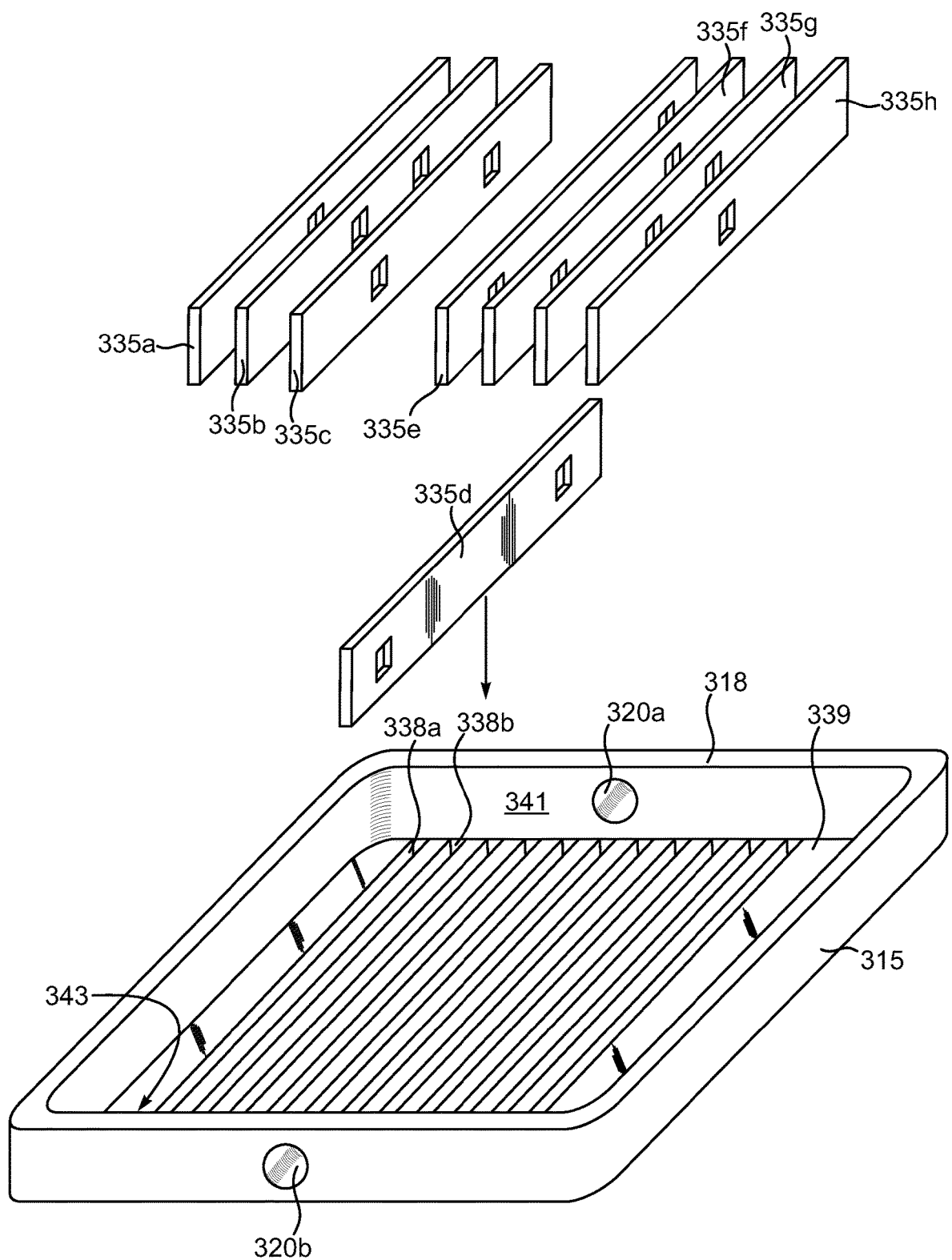
FIG. 8 is an exploded pictorial view of an alternate exemplary IHS.

In the foregoing arrangements described in conjunction with FIGS. 1, 2, 3, 4, 5 and 7, the IHSs 115 and 215 include opposing end slots (such as slots 245*a* and 245*b* in FIG. 7) to receive the various configurable heat fins 135*a*, 135*b*, 135*c*, 135*d*, 135*e*, 135*f*, 135*g* and 135*h*, 235*a*, 235*b*, 235*c*, 235*d*, 235*e*, 235*f*, 235*g* and 235*h*. However, it should be understood that there are many other possible ways to customize the arrangement of cooling fins while using a common IHS footprint. For example, FIG. 8 is an exploded pictorial view of an alternate exemplary IHS 315. The IHS 315 can include a shell 318 with inlet/outlet ports 320*a* and 320*b*. However in lieu of end slots, the shell 318 of the IHS 315 can include plural longitudinal slots 338*a*, 338*b*, etc. The longitudinal slots 338*a*, 338*b* are machined or otherwise fabricated into the ceiling 339 of the IHS 315. Plural customizable fins 335*a*, 335*b*, 335*c*, 335*d*, 335*e*, 335*f*, 335*g* and 335*h* or any of the disclosed alternatives thereto can be inserted in the slots 338*a* and 338*b* of the shell 318. In this illustrative arrangement, any or all of the fins 335*a*, 335*b*, 335*c*, 335*d*, 335*e*, 335*f*, 335*g* and 335*h* can be fabricated with a length such that any or all of the fins 335*a*, 335*b*, 335*c*, 335*d*, 335*e*, 335*f*, 335*g* and 335*h* contact the end surfaces 341 and 343 of the shell 318 of the IHS 315.

In the arrangement depicted in FIG. 8, any or all of the fins 335*a*, 335*b*, 335*c*, 335*d*, 335*e*, 335*f*, 335*g* and 335*h* can be fabricated with a length such that any or all of the fins 335*a*, 335*b*, 335*c*, 335*d*, 335*e*, 335*f*, 335*g* and 335*h* contact the end surfaces 341 and 343 of the shell 318 of the IHS 315.

Figure 9:
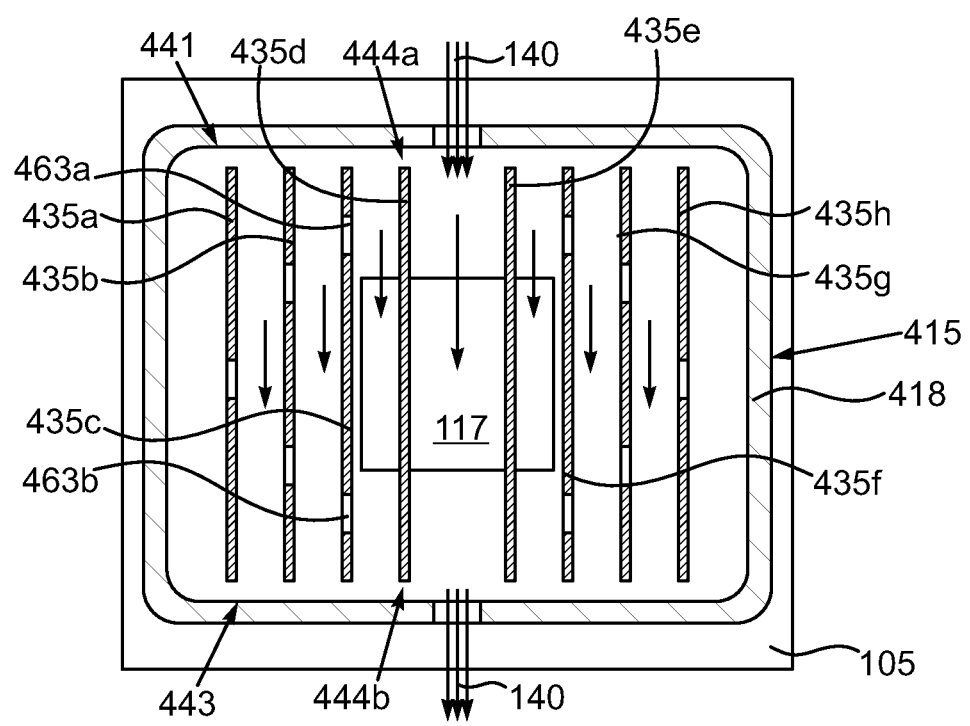
FIG. 9 is a sectional view like FIG. 2 but depicting an alternate exemplary IHS.

However, in another alternative exemplary arrangement, fins can be made short enough to leave gaps proximate with the IHS end surfaces. In this regard, attention is now turned to FIG. 9, which is a sectional view like FIG. 2, but depicting an alternative IHS 415 that includes a shell 418 mounted on the circuit board 105 over the semiconductor chip 117 and capable of delivering coolant 140. The fins 435a, 435b, 435c, 435d, 435e, 435f, 435g and 435h are inserted into longitudinal slots 415 (like the slots 338a and 338b depicted in FIG. 8 but not visible in FIG. 9) positioned between the end surfaces 441 and 443 of the shell 418. Any or all of the fins 435a, 435b, 435c, 435d, 435e, 435f, 435g and 435h can be fabricated to leave gaps 444a, 444b, etc., proximate the end surfaces 441 and 443 of the shell 418. Since the coolant 140 can flow through the gaps 444a, 444b, etc., it is possible to eliminate one or more of the ports of the fins 435a, 435b, 435c, 435d, 435e, 435f, 435g and 435h and still provide fluid communication with all of the fins 435a, 435b, 435c, 435d, 435e, 435f, 435g and 435h and adequate flow of coolant 140 past the semiconductor chip 117. For example, the fin 435d does not have ports, while fin 435c has ports 463a and 463b and so on for the other fins 435b, 435a, 435e, 435f, 435g and 435h.

Figure 10:
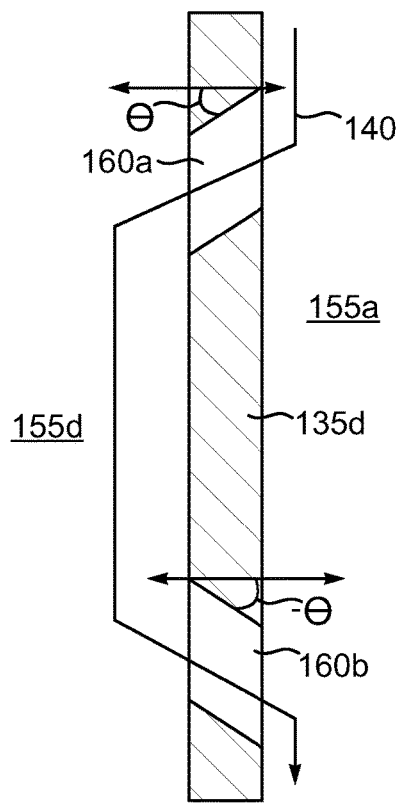
FIG. 10 is a sectional view of FIG. 3 taken at section 10-10.

Some additional details regarding an exemplary arrangement for the configurable fins and their respective flow ports can be understood by referring now to FIG. 10, which is a sectional view of FIG. 3 taken at section 10-10. Note that because of the location of section 10-10, the fin 135 is shown in section. The inlet port 160a, which delivers coolant 140 from the central channel 155a into the channel 155d can be angled as shown. Here, the inlet port 160a is slanted at some angle Θ. Similarly, the return port 160b can be beveled in the reverse direction, that is, at some angle -Θ or some other angle. In this way, the head loss associated with the coolant 140 passing through the port 160a will be reduced somewhat and vice versa for the coolant 140 returning through the port 160b. Of course the angles Θ and -Θ could be zero in that the ports 140 and 145 constitute 90° transitions from the initial flow path.

Figure 11:
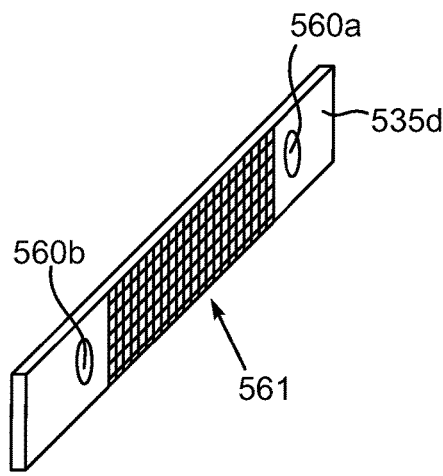
FIG. 11 is a pictorial view of an alternate exemplary configurable heat fin.

As noted briefly above, the fins 135d, 235d, 335d, 435d, 535d etc., and their ports, such as ports 160a, 160b, 263a, 263b, etc., can take on many different shapes. The ports 160a and 160b depicted in FIG. 3 for example have a generally square cross section. However, and as shown in FIG. 11, which is a pictorial view of an alternate of the fin 535d, alternative ports 560a and 560b can have circular cross sections. Of course as noted above, virtually any shape could be used. FIG. 11 also illustrates other possibilities for the disclosed fins 135d, 235d, 335d, 435d, 535d etc. The fin 535d includes a textured exterior surface 561, which provides greater surface area for heat transfer. Any or all the surfaces of the fin 535d could be textured. The texturing can be embossed, machined, etched or otherwise formed and take on a variety of shapes other than the checkerboard design depicted.

Figure 12:
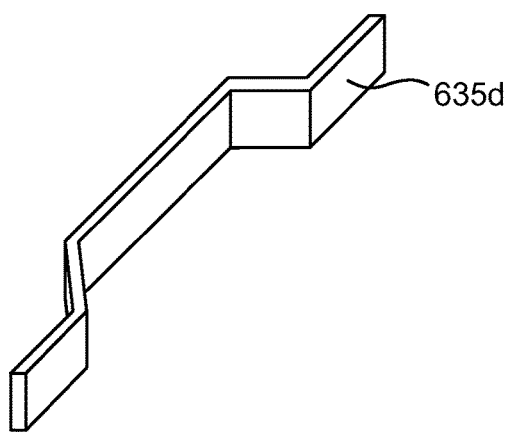
FIG. 12 is a pictorial view of another alternate exemplary arrangement of a configurable heat fin.

In the foregoing illustrative arrangements, the fins 135d, 235d, 335d, 435d, 535d etc., have a generally straight rectangular shape. However, other types of shapes are envisioned. For example, and as depicted in FIG. 12, an alternate exemplary fin 635d can have a serpentine shape. Other than purely straight rectangular shapes can provide additional surface area for fluid contact than a comparatively sized rectangular shape.

Figure 13:
FIG. 13 is an enlarged view of one exemplary heat fin engagement arrangement.
Figure 14:
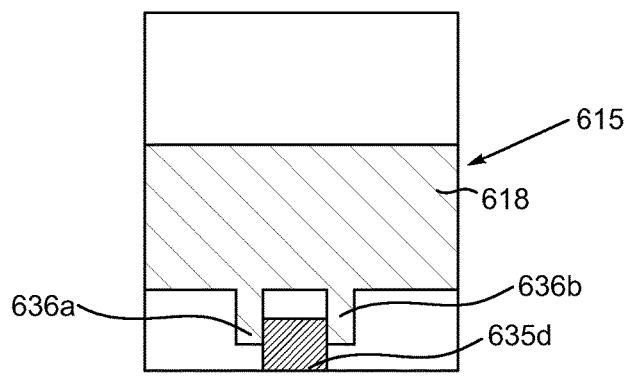
FIG. 14 is a sectional view like FIG. 13 but depicting another alternate exemplary heat fin engagement arrangement.

In the foregoing illustrative arrangements in, for example FIGS. 1, 2, 3, 4, 5 and 7, the fins 135d, 135d, 235c, 235d, etc., are secured to the IHS by way of the end slots 145a, 145b, 245a, 245b, etc. FIG. 13 depicts an overhead view of a portion of the circuit board 105, one of the slots 145a of the IHS 115 and an end of the fin 135d positioned therein. However, it should be understood that other types of structures can be used to engage the ends of fins. For example, FIG. 14 depicts a view like FIG. 13, but of an alternate exemplary IHS 615 with an alternate exemplary engagement member for the end of a fin. Here, the shell 618 of IHS 615 can include tabs 636a and 636b that are sized to receive the end of a fin 635d with a frictional engagement. The tabs 636a and 636b could be less than the full height (i.e., coming out of the page) of the shell 618 and still provide secure engagement of the fin 635d.

Figure 15:
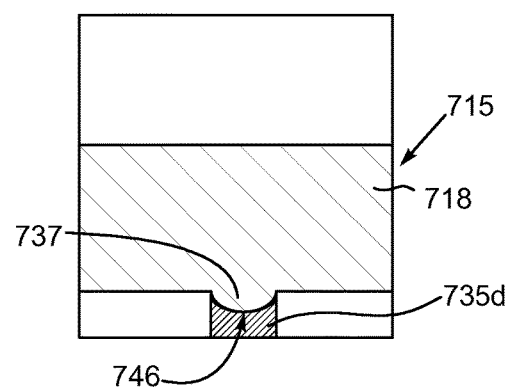
FIG. 15 is a sectional view like FIG. 14 but depicting another alternate exemplary heat fin engagement arrangement.

FIG. 15 depicts a view like FIGS. 13 and 14, but of an alternate exemplary IHS 715 with an alternate exemplary engagement member for the end of a fin. The shell 718 of the alternate exemplary IHS 715 can include inwardly projecting bumps 737 and the fins such as the fin 735d can include a cooperating end recess 746 that engages the bump 737. Again, it should be understood that a great variety of mechanical fastening techniques can be used to secure the fins 135d, 235d, 635d, 735d, etc. to the disclosed IHS arrangements.

Figure 16:
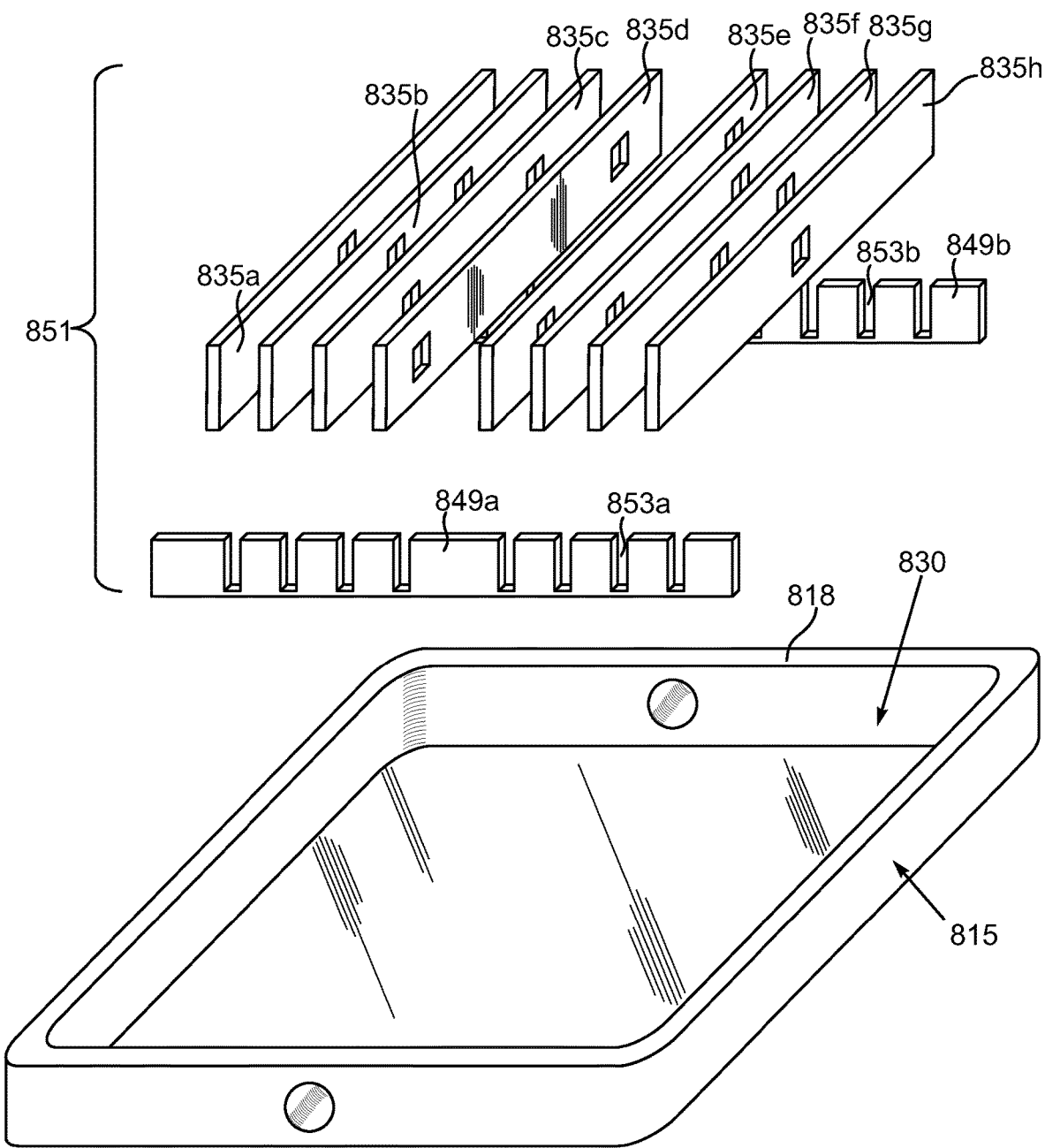
FIG. 16 is an exploded pictorial view depicting an alternate exemplary IHS with alternate exemplary configurable fins.

In the foregoing described arrangements, the fins 135d, 235d, 635d, 735d, etc., are generally secured to the various IHS arrangements by way of engagement members or other types of fasteners such as slots and tabs, etc. However, it should be understood that in other arrangements, the configurable fins can be pre-joined and then dropped in as a unit into an IHS and the combination of the IHS and the fin arrangement can be flipped over and mounted onto a circuit board such as the circuit boards 105, 205 disclosed herein. In this regard, attention is now turned to FIG. 16, which is an exploded pictorial view that depicts an alternate exemplary IHS 815 that includes a shell 818 that has an interior space 830 but does not include any fastening members or mechanisms to physically hold customizable fins. Instead, customizable fins, such as the fins 835a, 835b, 835c, 835d, 835e, 835f, 835g and 835h, can be joined together by way of slotted brackets 849a and 849b, which have respective plural slots 853a and 853b in which the ends of the fins 835a, 835b, 835c, 835d, 835e, 835f, 835g and 835h can be inserted into and create a drop-in heat fin assembly 851 that can be dropped into the interior space 830 of the IHS 815 and that combination mounted on a circuit board, such as the board 105 depicted in FIGS. 1 and 2. Friction fits, adhesives or solders can be used to make the connections between the fins 835a, 835b, 835c, 835d, 835e, 835f, 835g and 835h can be joined together by way of slotted brackets 849a and 849b. Again the number and configuration of the brackets 849a and 849b can be other than two and a variety of other different shapes. Indeed, the fins 835a, 835b, 835c, 835d, 835e, 835f, 835g and 835h can be other than the depicted rectangular sheet configuration. Furthermore, the fins 835a, 835b, 835c, 835d, 835e, 835f, 835g and 835h can number more or less than eight.

Figure 17:
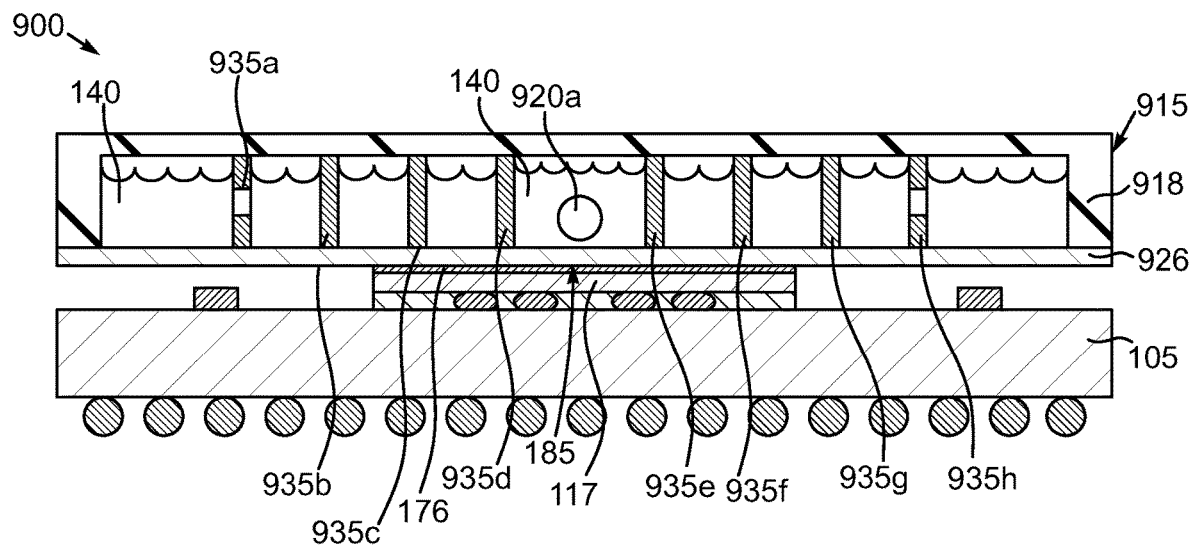
FIG. 17 is a sectional view like FIG. 4 but depicting an alternate exemplary IHS and semiconductor chip device.

In the foregoing illustrative arrangements, the various integrated heat spreaders provide for direct fluid communication with the heat generating component or components (the chips 117 and 217). However, it is possible to use the techniques disclosed herein to construct and use an integrated heat spreader that uses the same configurable heat fin concepts but without direct fluid communication with the heat generating component to be thermally managed. In this regard, attention is now turned to FIG. 17, which is a sectional view like FIG. 4 but depicting an alternate exemplary semiconductor chip device 900 that includes the aforementioned circuit board 105 and semiconductor chip 117 mounted thereon but in this case, an alternate exemplary integrated heat spreader 915 is mounted on top of the semiconductor chip 117 and without providing direct fluid communication to the chip 117. Here, the IHS 915 includes a shell 918 that is mounted on a base 926 and secured thereto by way of well-known adhesives, solder or other techniques. The base 926 is mounted on the TIM 176. The TIM 176 for this illustrative arrangement can be composed of well-known solders as described above or polymeric materials such as thermal greases or thermal pastes of silicone or other polymers, with or without conductive pillars such as silver particles or otherwise. The IHS 915 includes plural configurable fins 935a, 935b, 935c, 935d, 935e, 935f, 935g and 935h, which can be configured and used like the other disclosed configurable fin arrangements. If desired, the coolant 140 can be selectively routed as described elsewhere herein to provide preferential cooling for one region or other of the internal space 930 of the shell 918. A lid 9 (not shown) of a variety of configurations (e.g., top hat, bathtub, etc.,) could be placed over the semiconductor chip 117 and beneath the IHS 915 if desired.

Figure 18:
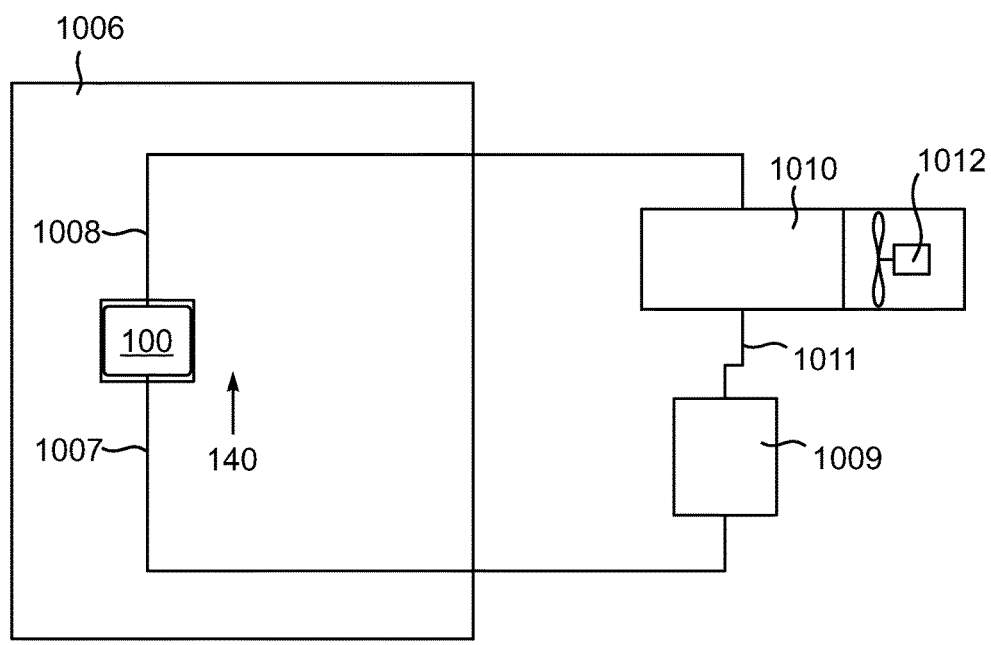
FIG. 18 is a block diagram of an exemplary computing device.

Any of the disclosed arrangements of the semiconductor chip device 100, 200, etc., can be used in a computing system. In this regard, FIG. 18 depicts a schematic diagram of an exemplary semiconductor chip device 100 mounted in a computing device 1006, which can be a computer, a server, a multimedia device or virtually any other computing device that can benefit from liquid cooling. The coolant 140 is delivered to the semiconductor chip device 100 by way of a fluid supply line 1007 and returned by way of a fluid return line 1008. The fluid supply line receives output coolant 140 from a pump 1009. The pump 1009 draws coolant 140 from a heat exchanger 1010 via a line 1011. The heat exchanger 1010 is connected to or otherwise receives forced air from a cooling fan 1012. The fluid return line 1008 is connected as an input to the heat exchanger 1010. Here, the heat exchanger 1010, the pump 1009 and the cooling fan 1012 are positioned external to the computing device 1006 but could all, or components thereof, be positioned inside the computing device 1006 as desired. This is a basic configuration. Multiple heat exchangers 1010 and fans 1012 and pumps 100 could be used as well.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An integrated heat spreader to provide thermal management of a first heat generating component on a circuit board, comprising:
a shell having an internal space, at least one inlet port to receive a coolant to cool the first heat generating component and at least one outlet port to discharge the coolant;
plural pre-fabricated heat fins connected to the shell in the internal space; and
wherein the pre-fabricated heat fins are selectively connectable to the shell in multiple arrangements to provide selected flow rates of the coolant in one or more regions of the internal space.

2. The integrated heat spreader of claim 1, comprising the circuit board, the integrated heat spreader being mounted on the circuit board over the first heat generating component.

3. The integrated heat spreader of claim 2, wherein the first heat generating component is in fluid communication with the coolant.

4. The integrated heat spreader of claim 2, wherein the first heat generating component is not in fluid communication with the coolant.

5. The integrated heat spreader of claim 1, wherein the pre-fabricated heat fins are connected to the shell by friction.

6. The integrated heat spreader of claim 1, wherein at least one of the pre-fabricated heat fins is in physical contact with the first heat generating component.

7. The integrated heat spreader of claim 1, wherein each of at least some of the pre-fabricated fins comprises a coolant inlet port and a coolant outlet port.

8. The integrated heat spreader of claim 1, wherein the shell comprises plural slots to receive the pre-fabricated heat fins.

9. The integrated heat spreader of claim 1, wherein at least some of the pre-fabricated heat fins have a textured exterior surface.

10. The integrated heat spreader of claim 1, comprising a second heat generating component on the circuit board, the pre-fabricated heat fins being arranged to provide a first fraction of an inlet flow rate of the coolant past the first heat generating component and a second fraction of the inlet flow rate of the coolant past the second heat generating component.

11. A semiconductor chip device, comprising:
a circuit board;
a first heat generating component mounted on the circuit board;
an integrated heat spreader mounted on the circuit board to provide thermal management of the first heat generating component, the integrated heat spreader including a shell having an internal space, at least one inlet port to receive a coolant to cool the first heat generating component and at least one outlet port to discharge the coolant, and plural pre-fabricated heat fins connected to the shell in the internal space; and
wherein the pre-fabricated heat fins are selectively connectable to the shell in multiple arrangements to provide selected flow rates of the coolant in one or more regions of the internal space.

12. The semiconductor chip device of claim 11, wherein the first heat generating component is in fluid communication with the coolant.

13. The semiconductor chip device of claim 11, wherein the first heat generating component is not in fluid communication with the coolant.

14. The semiconductor chip device of claim 11, wherein the pre-fabricated heat fins are connected to the shell by friction.

15. The semiconductor chip device of claim 11, wherein at least one of the pre-fabricated heat fins is in physical contact with the first heat generating component.

16. The semiconductor chip device of claim 11, wherein each of at least some of the pre-fabricated fins comprises a coolant inlet port and a coolant outlet port.

17. The semiconductor chip device of claim 11, comprising a second heat generating component on the circuit board, the pre-fabricated heat fins being arranged to provide a first fraction of an inlet flow rate of the coolant past the first heat generating component and a second fraction of the inlet flow rate of the coolant past the second heat generating component.

18. A method of manufacturing an integrated heat spreader operable to provide thermal management of a first heat generating component on a circuit board, comprising:
    fabricating a shell having an internal space, at least one inlet port to receive a coolant to cool the first heat generating component and at least one outlet port to discharge the coolant;
    connecting plural pre-fabricated heat fins to the shell in the internal space; and
    wherein the pre-fabricated heat fins are selectively connectable to the shell in multiple arrangements to provide selected flow rates of the coolant in one or more regions of the internal space.

19. The method of claim 18, comprising mounting the integrated heat spreader on the circuit board over the first heat generating component.

20. The method of claim 19, wherein the first heat generating component is in fluid communication with the coolant.

21. The method of claim 19, wherein the first heat generating component is not in fluid communication with the coolant.

22. The method of claim 19, wherein at least one of the pre-fabricated heat fins is in physical contact with the first heat generating component.

23. The method of claim 18, comprising connecting the pre-fabricated heat fins to the shell by friction.

24. The method of claim 18, wherein the circuit comprises a second heat generating component, the method comprising arranging the pre-fabricated heat fins to provide a first fraction of an inlet flow rate of the coolant past the first heat generating component and a second fraction of the inlet flow rate of the coolant past the second heat generating component.

* * * * *